United States Patent [19]

Lee

[11] Patent Number: 5,430,320
[45] Date of Patent: Jul. 4, 1995

[54] THIN FILM TRANSISTOR HAVING A LIGHTLY DOPED DRAIN AND AN OFFSET STRUCTURE FOR SUPPRESSING THE LEAKAGE CURRENT

[75] Inventor: Jae-won Lee, Seoul, Rep. of Korea
[73] Assignee: Samsung Electronics Co, Ltd., Suwon City, Rep. of Korea
[21] Appl. No.: 168,178
[22] Filed: Dec. 17, 1993

[30] Foreign Application Priority Data

Oct. 30, 1993 [KR] Rep. of Korea .................... 93-22946

[51] Int. Cl.⁶ .................... H01L 27/01; H01L 27/13; H01L 29/78
[52] U.S. Cl. .................... 257/412; 257/66; 257/410; 257/900
[58] Field of Search .................... 257/66, 352, 353, 354, 257/410, 411, 412, 900

[56] References Cited

U.S. PATENT DOCUMENTS

| | | | |
|---|---|---|---|
| 5,091,763 | 2/1992 | Sanchez | 257/900 |
| 5,183,771 | 2/1993 | Mitsui et al. | 257/900 |
| 5,208,472 | 5/1993 | Su et al. | 257/900 |
| 5,288,666 | 2/1994 | Lee | 437/200 |
| 5,369,303 | 11/1994 | Wei | 257/751 |

FOREIGN PATENT DOCUMENTS 4-2168  1/1992  Japan .................... 257/412

Primary Examiner—Ngân V. Ngô
Attorney, Agent, or Firm—Foley & Lardner

[57] ABSTRACT

A thin film transistor wherein generation of a leakage current is prevented to improve the operation stability thereof and a method for manufacturing the same. A polysilicon layer is formed on an insulating layer. A gate insulating layer is formed on the polysilicon layer. A gate electrode having a barrier layer formed thereon is formed on the gate insulating layer. The sidewall surface portion of the gate electrode is anodic oxidized to form a metal oxide layer on the sidewall of the gate electrode. A lightly doped drain region having a lower impurity concentration than that of source and drain regions of the thin film transistor or an offset region wherein no impurity is doped is formed in a portion of the polysilicon layer under the metal oxide layer. The thin film transistor may be manufactured by a low temperature process, and leakage current is suppressed when a reverse bias voltage is applied. Therefore, the operation stability of the thin film transistor is improved.

8 Claims, 6 Drawing Sheets

THIN FILM TRANSISTOR HAVING A LIGHTLY DOPED DRAIN AND AN OFFSET STRUCTURE FOR SUPPRESSING THE LEAKAGE CURRENT

BACKGROUND OF THE INVENTION

1. Field of the Invention

The present invention relates to a thin-film transistor (TFT) and a method for manufacturing the same, and more particularly, to a TFT having a lightly doped drain (LDD) and an offset structure for suppressing the leakage current and a method for manufacturing the same.

2. Description of the Prior Art

Generally, a thin-film transistor (TFT) is used as a switching device in an active matrix liquid crystal device (LCD) for controlling the operation of each pixel. Further, a TFT can be applied to a semiconductor memory device or an image sensor.

To manufacture the TFT, which is used as a switching device, polysilicon, amorphous silicon, etc. have been used as the main material. A polysilicon TFT has a field effect mobility of 10–200 $cm^2/V.s$ which is far greater than that of 1 $cm^2/V.s$ of an amorphous silicon TFT. Thus, the polysilicon TFT has an advantage in that it has a higher on-current handling capability so that it is widely used in a high-density display device having a large capacitance or a memory device.

In the meantime, when manufacturing a polysilicon TFT for a liquid display device, a cheap glass substrate should be used to lower the manufacturing cost, as in the case of manufacturing an amorphous silicon TFT. Therefore, the process for manufacturing the polysilicon TFT should be performed at a limited temperature (below about 600° C.) due to the thermal characteristics of the glass substrate. Further, an annealing process, after performing an ion-implantation into a silicon layer for forming the source and drain regions of a transistor, cannot be performed at a sufficiently high temperature due to the limited temperature. Therefore, the crystalline characteristics of the silicon layer is not sufficiently recovered. A TFT obtained in accordance with the above process at a low temperature has a high leakage current at a reverse biased voltage and a signal delay due to the resistance of the used material which are not found in a TFT obtained by a high temperature annealing process. Carriers trapped in the defects inside the active region are moved to a drain region by an electric field applied between a gate electrode and a drain region to generate leakage current.

To prevent such a leakage current, in a conventional metal oxide semiconductor (MOS) device, a method has been suggested for weakening the electric field applied between the gate electrode and a drain region. For example, an LDD-structured device or an offset-structured device has been suggested for this purpose.

FIG. 1 is a sectional view for illustrating a conventional LDD-structured MOS TFT.

Referring to FIG. 1, a conventional LDD-structured NMOS TFT will be explained hereinafter. On an insulating substrate 10, a polysilicon layer 12 is formed, which comprises n+ source and drain regions 12a wherein an n-type impurity has been highly doped, a channel region 12b between source and drain regions 12a, and an n-LDD region 12c between source and drain regions 12a and channel region 12b wherein n-type impurities have been lightly doped. On polysilicon layer 12, which comprises source and drain regions 12a, channel region 12b and LDD region 12c, a gate insulating layer 14 is formed and a gate electrode 15 comprising an impurity-doped polysilicon is formed on a portion of the gate insulating layer 14 over channel region 12b. Silicon thermal oxide layer 16 covering the upper and sidewall surfaces of gate electrode 15 is formed over LDD region 12c. Source and drain regions 12a and gate electrode 15 make up an NMOS LDD-structured TFT. An insulating interlayer 17 is formed on the structure having the above TFT for electrically isolating the TFT from a conductive layer which is formed in a subsequent step. Metal wirings 18 connected to source and drain regions 12a and gate electrode 15 are formed on insulating interlayer 17 for operating the above-described TFT.

The above-described NMOS LDD-structured TFT is manufactured as follows. At first, the thin polysilicon layer 12 is formed on the insulating substrate 10. On polysilicon layer 12, gate insulating layer 14 is formed by depositing an insulating material such as silicon oxide or by thermally oxidizing the upper surface portion of the polysilicon layer. Then, a material for forming a gate electrode, such as impurity-doped polysilicon, is deposited on the gate insulating layer 14 to form a conductive layer. The conductive layer is patterned via a conventional photolithography process to complete the gate electrode 15. Thereafter, to form LDD region 12c in polysilicon layer 12, an impurity is firstly implanted at a low dosage using gate electrode 15 as an ion-implantation mask. Here, since the impurity is blocked by gate electrode 15, a channel region 12b is formed between the source and drain regions 12a in a portion of the polysilicon layer 12 below gate electrode 15.

Thereafter, the surface portion of gate electrode 15 is thermally oxidized at a high temperature of about 900°–1,000° C. to form a silicon thermal oxide layer 16 on its sidewalls and on the upper surface of gate electrode 15. Thermal oxide layer 16 is formed so as to have a thickness of about 0.1–1.2 $\mu$m. Then, a second implantation is performed at a higher dosage by using thermal oxide layer 16 as an ion-implantation mask, to form source and drain regions 12a in the polysilicon layer 12. Therefore, LDD region 12c having a width of about 0.1–1.2 $\mu$m is obtained between the source and drain regions 12a and the channel region 12b. On the whole surface of the structure thus obtained, an insulating material such as silicon oxide is deposited to form an insulating interlayer 17. Then, contact holes exposing surface portions of the surface and drain regions 12a and the gate electrode 15 are formed in insulating interlayer 17. Thereafter, metal wirings 18 are formed through the contact holes for electrically connecting the elements of the TFT, to complete a MOS TFT.

In the above described LDD-structured TFT, since the electric field applied between the gate electrode and the drain region is weakened due to the presence of the LDD region, the leakage current may be reduced considerably whenever a reverse bias voltage is applied. The above process exhibits a good reproducibility and may be easily controlled. However, since thermal oxide layer 16 is formed by thermally oxidizing the surface portion of gate electrode 15 at a high temperature of about 1,000° C., the above described TFT cannot be formed on a glass substrate having a process temperature limit of 600° C. When the above TFT should be formed on a glass substrate by a low temperature process, the good crystalline characteristics of the gate electrode may not obtained. Therefore, a higher resistance thereof is obtained than the resistance obtained in the high temperature process. This generates signal delay and increases the line width when forming the TFT having a high packaging density.

FIG. 2 is a sectional view for illustrating a conventional offset-structured MOS TFT for reducing the leakage current.

Referring to FIG. 2, a conventional offset-structured NMOS TFT will be explained hereinafter. On an insulating substrate 20, a polysilicon layer 22 is formed, which comprises an n+ source and drain regions 22a wherein an n-type impurity has been highly doped, a channel region 22b between source and drain regions 22a and an offset region 22c having a predetermined width between source and drain regions 22a and channel region 22b. On polysilicon layer 22, which comprises source and drain regions 22a, channel region 22b and offset region 22c, an gate insulating layer 24 is formed. A gate electrode 25 comprising a metal is then formed on a portion of the gate insulating layer 24 over channel region 22b. An anodic oxidation layer 26 covering the upper and sidewall surfaces of gate electrode 25 is formed over offset region 22c. Source and drain regions 22a and gate electrode 25 make up an NMOS offset-structured TFT. An insulating interlayer 27 is formed on the structure having the above TFT for electrically isolating the TFT from a conductive layer which is formed in a subsequent step. Metal wirings 28 connected to source and drain regions 22a and gate electrode 25 are then formed on insulating interlayer 27 for operating the abovedescribed TFT.

The above-described NMOS offset-structured TFT is manufactured as follows. A thin polysilicon layer 22 is formed on the insulating substrate 20. On polysilicon layer 22, gate insulating layer 24 is formed by depositing an insulating material such as silicon oxide or by thermally oxidizing the upper surface portion of the polysilicon layer 22. Then, a metal for forming a gate electrode such as aluminum is deposited on gate insulating layer 24 to form a metal layer. The metal layer is patterned via a conventional photolithography process to complete gate electrode 25. Thereafter, the resultant having gate electrode 25 formed thereon is anodic-oxidized via a conventional anodic oxidation to form anodic oxidation layer 26 on its sidewalls and on the upper surface of gate electrode 15. Anodic oxidation layer comprises an oxide of a metal comprising gate electrode 25. Then, ion implantation is performed at a high dosage by using anodic oxidation layer 26 as an ion-implantation mask, to form source and drain regions 22a in the polysilicon layer 22. Consequently, offset region 22c having a predetermined width is obtained between the source and drain regions 22a and the channel region 22b. On the whole surface of the structure thus obtained, an insulating material such as silicon oxide is deposited to form an insulating interlayer 27. Then, contact holes exposing surface portions of the surface and drain regions 22a and the gate electrode 25 are formed in insulating interlayer 27. Thereafter, metal wirings 28 are formed through the contact holes for electrically connecting the elements of the TFT, to complete a MOS TFT.

In the above-described offset-structured TFT, since the electric field applied between the gate electrode and the drain region is weakened due to the presence of the offset region, the leakage current may be reduced considerably whenever a reverse bias voltage is applied. However, for forming a metal wiring 28 to operate gate electrode 25, a contact hole should be formed by partially etching the anodic oxidation layer 26 formed on the gate electrode 25. At this time, since the etching selectivity of anodic oxidation layer 26 with respect to gate electrode 25 is low, there is a high probability that gate electrode 25 would be damaged during the etching step of anodic oxidation layer 26. This deteriorates the reliability of the TFT. Further, anodic oxidation occurs both on the upper and sidewall surfaces of gate electrode 25, the gate electrode should be thicker to increase the thickness of anodic oxidation layer. However, since increasing the thickness of the gate electrode is limited, it is very difficult to obtain an anodic oxidation layer having a desired thickness.

SUMMARY OF THE INVENTION

To solve the problems of the conventional TFT, it is a first object of the present invention to provide an LDD-structured TFT having a novel structure wherein the generation of the leakage current is suppressed to improve the stability of the operation thereof.

It is a second object of the present invention is to provide an offset-structured TFT having a novel structure wherein the generation of the leakage current is suppressed to improve the stability of the operation thereof.

It is a third object of the present invention to provide a method for manufacturing a TFT which is suitable for manufacturing the above-mentioned LDD-structured TFT of the present invention.

It is a fourth object of the present invention to provide a method for manufacturing a TFT which is suitable for manufacturing the above-mentioned offset-structured TFT of the present invention.

To accomplish the first object of the present invention, there is provided a thin film transistor comprising: an insulating substrate; a polysilicon layer comprising source and drain regions formed therein, a channel region formed between the source and drain region, an impurity doped region formed between the source and drain regions and the channel regions; a gate insulating layer formed on the polysilicon layer; a gate electrode formed on the gate insulating layer over the channel region, the gate electrode comprising a metal; a metal oxide layer formed on the sidewalls of the gate electrode over the impurity doped region; and a barrier layer formed on the gate electrode.

To accomplish the second object of the present invention, there is provided a thin film transistor comprising: an insulating substrate; a polysilicon layer comprising source and drain regions formed therein, a channel region formed between the source and drain region, an offset region formed between the source and drain regions and the channel regions; a gate insulating layer formed on the polysilicon layer; a gate electrode formed on the gate insulating layer over the channel region, the gate electrode comprising a metal; a metal oxide layer formed on the sidewalls of the gate electrode over the offset region; and a barrier layer formed on both the gate electrode and the metal oxide layer.

To accomplish the third object of the present invention, there is provided a method for manufacturing a thin film transistor comprising the steps of: forming a polysilicon layer on an insulating substrate; forming a gate insulating layer on the polysilicon layer; forming a metal gate electrode having a barrier layer formed thereon on the gate insulating layer; implanting an impurity firstly into the polysilicon layer using the barrier layer as an implantation mask to form a first impurity-doped region in portions of the polysilicon layer; oxidizing the sidewall surface portion of the gate electrode to form a metal oxide layer on the sidewalls of the gate electrode; and implanting an impurity secondly into the polysilicon layer using the barrier layer and the metal oxide layer as an implantation mask to form a second impurity doped region having a higher impurity concentration than that of the first impurity-doped region.

To accomplish the fourth object of the present invention, there is provided a method for manufacturing a thin film transistor comprising the steps of: forming a polysilicon layer on an insulating substrate; forming a gate insulating layer on the polysilicon layer; forming a metal gate electrode having a barrier layer formed thereon on the gate insulating layer; implanting an impurity into the polysilicon layer using the barrier layer as an implantation mask to form an impurity-doped region in portions of the polysilicon layer; and oxidizing the sidewall surface portion of the gate electrode to form a metal oxide layer on the sidewall of the gate electrode, a portion of the polysilicon layer below the metal oxide layer being an offset region of the thin film transistor.

According to one embodiment of the present invention, the barrier layer preferably comprises a metal different than the metal having the gate electrode, an oxide and a nitride. When a metal different than that of gate electrode is used, a metal having good conductivity which can prevent the metal atoms of the gate electrode from penetrating the insulating interlayer is formed thereon. Such metals include Cr, Ta, Mo, Ti, etc. Further, a metal compound thereof such as TiN may be used for the barrier layer.

The metal oxide layer preferably comprises an oxide of the metal of the gate electrode. The gate electrode may be formed by using Mo, Ta, Al, Ni, Zr, Ti, Pd, Au, Ag, Co, etc.

According to another embodiment of the present invention, the gate electrode may comprise a metal whose oxide is formed so as to extend outwardly during anodic oxidization of the sidewall surface portion of the gate electrode for forming the metal oxide layer. As such a metal, such as Ta may be used.

According to yet another embodiment of the present invention, the gate electrode may comprise a metal whose oxide is formed so as to extend inwardly during the anodic oxidization of the sidewall surface portion of the gate electrode for forming the metal oxide layer. As such a metal, such as Al may be used.

According to the present invention, due to the presence of the barrier layer on the gate electrode, the thickness of the gate electrode can be easily controlled and the barrier layer prevents the anodic oxidation on the upper surface of the gate electrode, whereby thinning the thickness of gate electrode may be avoided.

When forming the gate electrode by using a metal whose oxide is formed outwardly during the anodic oxidation for forming the metal oxide layer, after firstly implanting an impurity in the polysilicon layer using the barrier layer as an implantation mask, the sidewall surface of the gate electrode is anodic oxidized to form the metal oxide layer. Thereafter, using the barrier layer and the metal oxide layer as implantation mask, an impurity is secondly implanted to form source and drain regions in the polysilicon layer. This completes the LDD-structured TFT. The electrical field applied between the source and drain regions and the gate electrode is weakened. Therefore, the leakage current is suppressed by the LDD region.

When forming the gate electrode by using a metal whose oxide is formed inwardly during the anodic oxidation for forming the metal oxide layer, after implanting an impurity in the polysilicon layer using the barrier layer as an implantation mask to form source and drain regions of the TFT, the sidewall surface of the gate electrode is anodic oxidized to form the metal oxide layer. Therefore, an offset region is formed between the channel region and the source and drain regions and under the metal oxide layer. This completes an offset-structured TFT. The electrical field applied between the source and drain regions and the gate electrode is weakened in this case also. Therefore, the leakage current is suppressed by the offset region.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Hereinafter, the present invention will be explained in detail with reference to the attached drawings.

Figure 1:
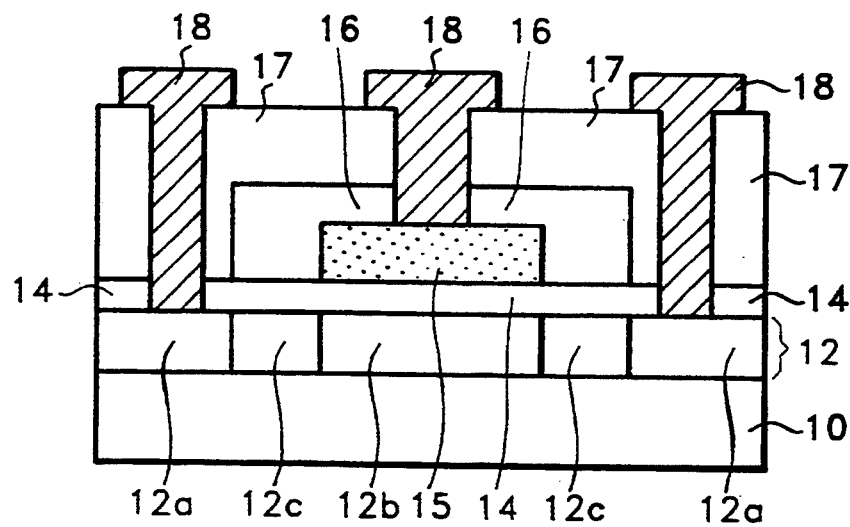
FIG. 1 is a sectional view for illustrating a conventional LDD-structured MOS TFT.
Figure 2:
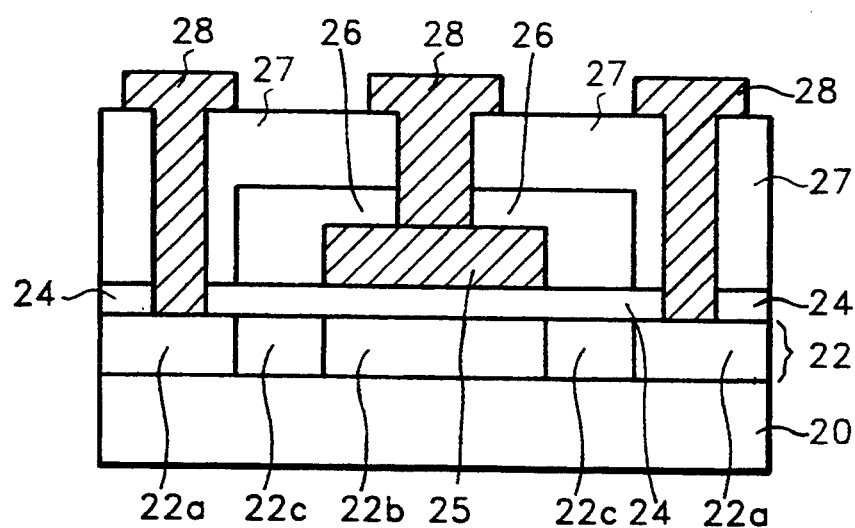
FIG. 2 is a sectional view for illustrating a conventional offset-structured MOS TFT for reducing the leakage current.
Figure 3:
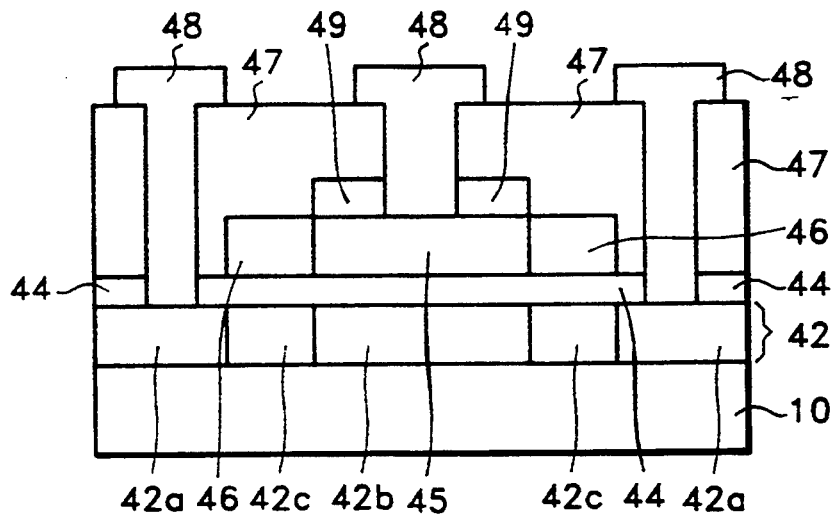
FIG. 3 is a sectional view illustrating an LDD-structured MOS TFT according to an embodiment of the present invention.

FIG. 3 is a sectional view illustrating an LDD-structured MOS TFT according to one embodiment of the present invention.

Referring to FIG. 3, an LDD-structured NMOS TFT according to an embodiment of the present invention will be explained. On an insulating substrate 40, a polysilicon layer 42 is formed, which comprises an n+ source and drain regions 42a wherein an n-type impurity has been highly doped, a channel region 42b between source and drain regions 42a and an n−LDD region 42c between source and drain regions 42a and channel region 22b wherein an n-type impurity has been lightly doped. LDD region 42c has an impurity concentration lower than that of source and drain regions 42a. On polysilicon layer 42, which comprises of source and drain regions 42a, channel region 42b and LDD region 42c, a gate insulating layer 44 is formed and a gate electrode 45 comprising a metal is formed on a portion of gate insulating layer 44 over the channel region 42b. A metal oxide layer 46 is formed on the sidewall surfaces of gate electrode 45 over LDD region 42c. On gate electrode 45, a barrier layer 49 is formed. Source and drain regions 42a and gate electrode 45 make up an NMOS LDD-structured TFT. An insulating interlayer 47 is formed on the structure having the above TFT for electrically isolating the TFT from a conductive layer which is formed in a subsequent step and metal wirings 48 connected to source and drain regions 42a and gate electrode 45 are formed on insulating interlayer 47 for operating the above TFT.

In the above TFT, a metal with oxide obtained by anodic oxidation is formed on the sidewalls of the gate electrode 45 so as to extend outwardly and used as a material constituting the gate electrode 45. For example, Ta, Al, Mo, Cr, Zr, Pd, Au, Ag, Co, Ti, Ni, etc. may be used as a metal for forming gate electrode 45. As a material for barrier layer 49, a metal different than that of gate electrode 45, an oxide, a nitride, etc. may be used. When a metal different than that of the gate electrode 45 is used, a metal having good conductivity which can prevent the metal atoms of the gate electrode 45 from penetrating the insulating interlayer 47 is formed thereon. Such metals include Cr, Ta, Mo, Ti, Al, Ni, Pd, Au, Ag, Co, Zr, etc. Further, a metal compound thereof such as TiN may be used for forming the barrier layer 49. As an oxide which may be used for the barrier layer 49 in the present invention, silicon oxide (SiO$_2$) may be used. As a nitride which may be used for the barrier layer 49 in the present invention, silicon nitride (Si$_3$N$_4$) may be used.

Metal oxide layer 46 preferably comprises an oxide of the metal constituting the gate electrode 45 which is obtained by anodic oxidation of the metal. For example, an oxide, such as AlO$_x$, TiO$_x$, TaO$_x$, MoO$_x$, CrO$_x$, etc. may be used.

FIGS. 6A to 6F are sectional views for illustrating a method for manufacturing a TFT according to an embodiment of the present invention to manufacture the TFT shown in FIG. 3.

Figure 6A:
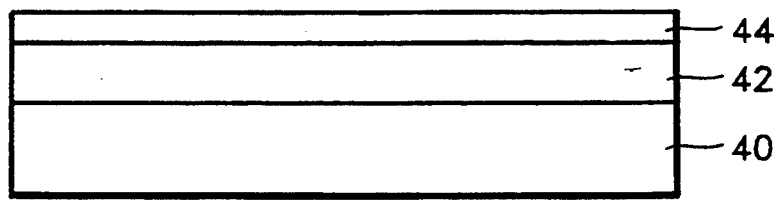
FIGS. 6A to 6F are sectional views for illustrating a method for manufacturing a TFT according to an embodiment of the present invention to manufacture a TFT as shown in FIG. 3.

FIG. 6A illustrates the steps for forming a thin polysilicon layer 42 and a gate insulating layer 44. On an insulating substrate 40, such as a glass substrate, polysilicon is deposited via a conventional low pressure chemical vapor deposition (LPCVD) to form polysilicon layer 42. On polysilicon layer 42, gate insulating layer 44 is formed by depositing an insulating material such as silicon oxide or by thermally oxidizing the upper surface portion of polysilicon layer 42.

Figure 6B:
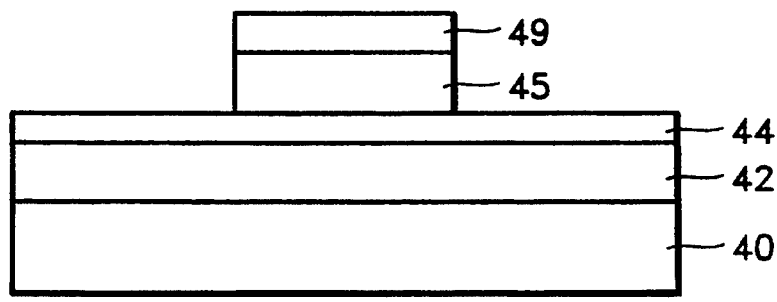

FIG. 6B illustrates the step for forming a gate electrode 45 and a barrier layer 49. More particularly, on gate insulating layer 44, a first material for forming gate electrode 45 such as Ta, Al, Mo, Cr, Zr, Pd, Au, Ag, Co, Ti, Ni, etc. is deposited via a sputtering method to form a first material layer. Then a second material for forming a barrier layer such as a metal different than that of gate electrode 45, an oxide, a nitride, etc. is deposited via a sputtering method or a CVD method on the first material layer, to give a second material layer. Thereafter, the first and second material layers are subsequently patterned via a conventional photolithography process to form gate electrode 45 having barrier layer 49 formed thereon.

Figure 6C:
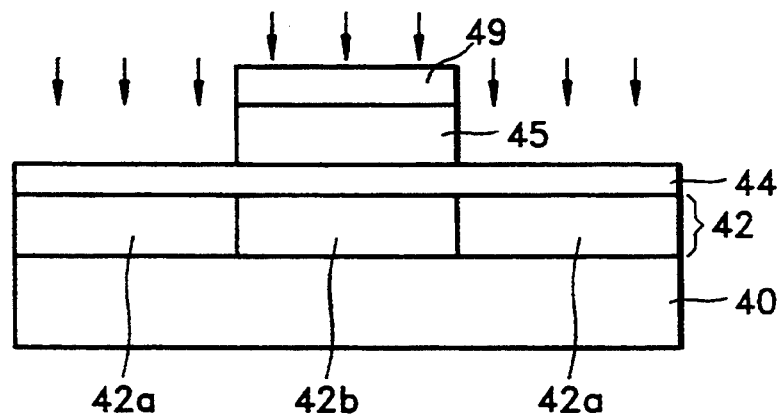

FIG. 6C illustrates the steps for implanting an impurity in polysilicon layer 42 and forming a channel region 42b. After the steps in FIG. 6B, to form an LDD region of the TFT, an n-type impurity is implanted at a low dosage by using barrier layer 49 as an ion-implantation mask, to form first impurity doped regions 43 having a low impurity concentration in portions of polysilicon layer 42 which are not masked by barrier layer 49. At this time, channel region 42b is formed in a portion between first impurity doped regions 43 of polysilicon layer 42 under gate electrode 49.

Figure 6D:
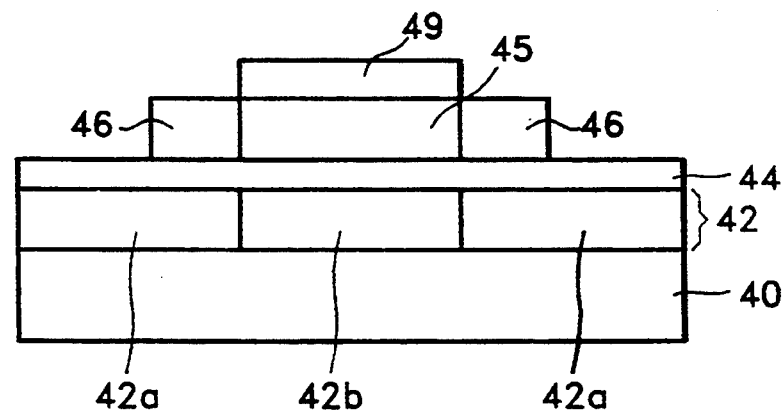
Figure 8:
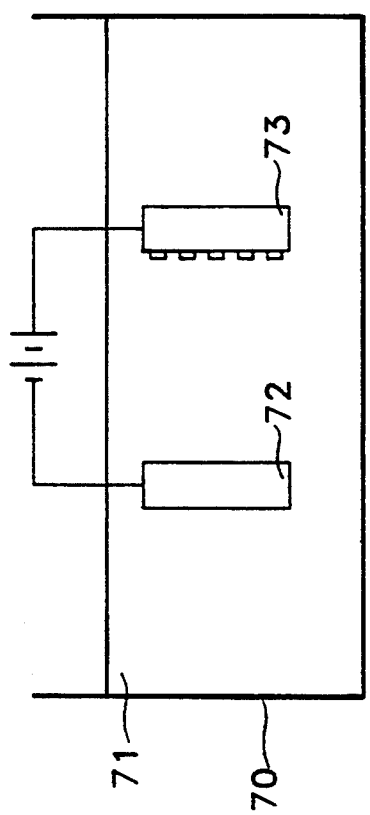
FIG. 8 is a schematic view for illustrating an anodic oxidation system used in the present invention.

FIG. 6D illustrates the steps for forming a metal oxide layer 46 on the sidewall of gate electrode 45. After the steps in FIG. 6D, the above-formed structure undergoes an anodic oxidation. Gate electrode comprises a metal, such as Ta, in which the oxide grows so as to expand outwardly during the anodic oxidation step. At this time, since an anodic oxidation solution cannot make contact with the upper surface of the gate electrode 45 due to the presence of barrier layer 49, the sidewall surface portion of the gate electrode 45 is anodic oxidized so that the metal oxide layer grows only on the sidewalls of the gate electrode 45. That is, the barrier layer 49 prevents the formation of an oxidation layer (which may be formed by anodic oxidizing the upper surface portion of the gate electrode 45) so that the thickness of the gate electrode 45 is not reduced. A conventional anodic oxidation method can be used in the present invention. FIG. 8 is a schematic view for illustrating an anodic oxidation system used in the present invention. In the same figure, reference numeral 70 denotes a water bath, reference numeral 71 denotes an aqueous ammonium tartrate solution (3 wt %), reference numeral 72 denotes a stainless steel electrode and reference numeral 73 denotes a substrate which is to undergo anodic oxidation. After filling the water bath 71 with the aqueous ammonium tartrate solution, an electrode 72 comprising stainless steel and substrate 73 which is to undergo anodic oxidation are immersed in the solution. Then, a direct bias is applied to electrode 72 and substrate 73. At this time, the thickness of metal oxide layer 46 may be controlled by adjusting the power of the direct bias. It is preferable that anodic oxidation be performed so that metal oxide layer 46 has a thickness of about 0.1-2 μm.

Figure 6E:
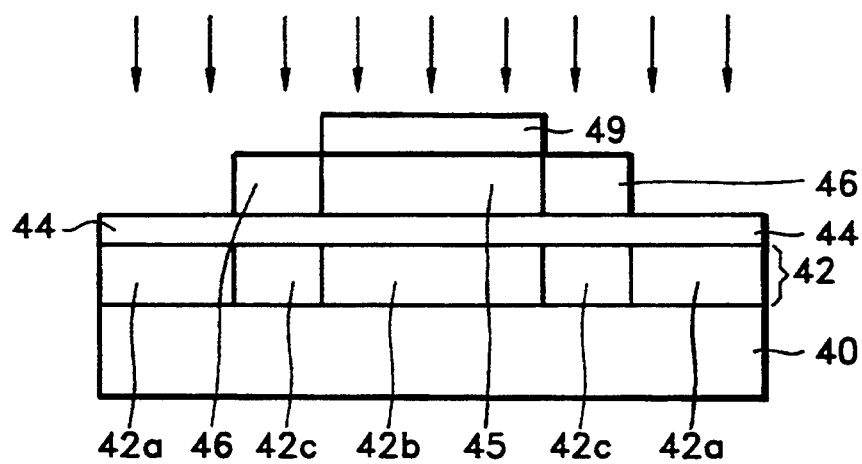

FIG. 6E illustrates the steps of implanting an impurity to form source and drain region 42a. After the anodic oxidation, an n-type impurity is implanted at a dosage which is higher than the dosage in the first implantation step, by using metal oxide layer 46 and barrier layer 49 as an implantation mask so that source and drain regions 42a are self-aligningly formed in polysilicon layer 42. As a result, the LDD region of a TFT is formed in portions of polysilicon layer 42 between source and drain regions 42a and channel region 42c and under metal oxide layer 46. LDD regions 42c thus obtained have the same width as the thickness of metal oxide layer 46.

Figure 6F:
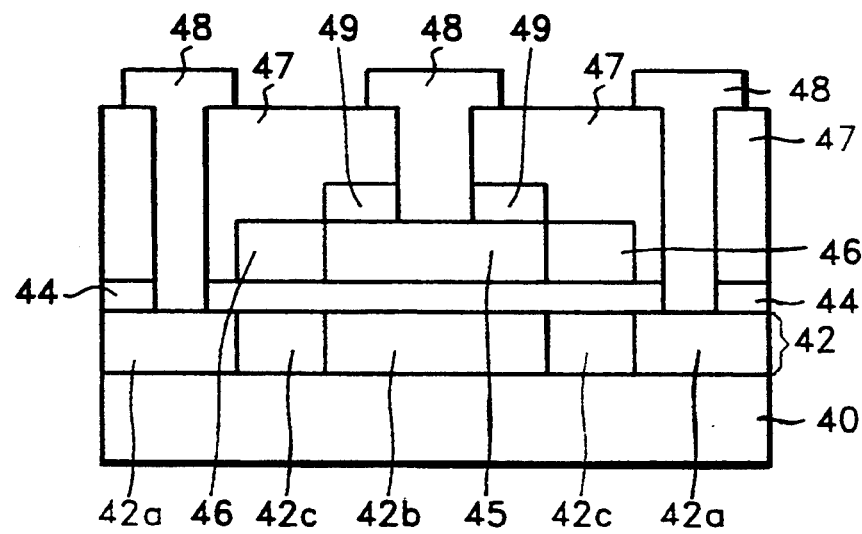

FIG. 6F illustrates the steps for forming an insulating interlayer 47 and metal wirings 48 for operating the TFT. After the steps in FIG. 6E, an insulating material such as an oxide is deposited on the whole surface of the above-formed structure to form insulating interlayer 47. Then, contact holes are formed by partially etching insulating interlayer 47, gate oxide layer 44 and barrier layer 49 via a conventional photolithography process so that a surface portion of gate electrode 45 and surface portions of polysilicon layer 42 wherein source and drain regions 42a are formed, are exposed. Thereafter, aluminum or an aluminum alloy is deposited on the whole surface of the structure to form a metal wiring layer filling the contact holes and then the metal wiring layer is patterned via a conventional photolithography process to form metal wirings 48. Consequently, this completes an LDD-structured MOS TFT of the present invention.

In the above-described LDD-structured TFT, according to an embodiment of the present invention, barrier layer 49 prevents the formation of an anodic oxidation layer on the upper surface. Therefore, the thinning of the thickness of the gate electrode and the increase in the resistance thereof may be avoided. Further, barrier layer 49 plays the role of implantation mask when performing an implantation for forming the LDD regions and source and drain regions and prevents the metal atoms of the gate electrode from diffusing into the insulating interlayer.

It is preferable that the barrier layer be formed so as to have a thickness similar to the thickness of the gate insulating layer. In this case, the etching is offset due to the difference in the thickness of these layers during the formation of contact holes. Further, various combinations of materials for the barrier layer may be selected so that a sufficient etching selectivity may be ensured during the formation of the contact hole on the gate electrode.

Figure 4:
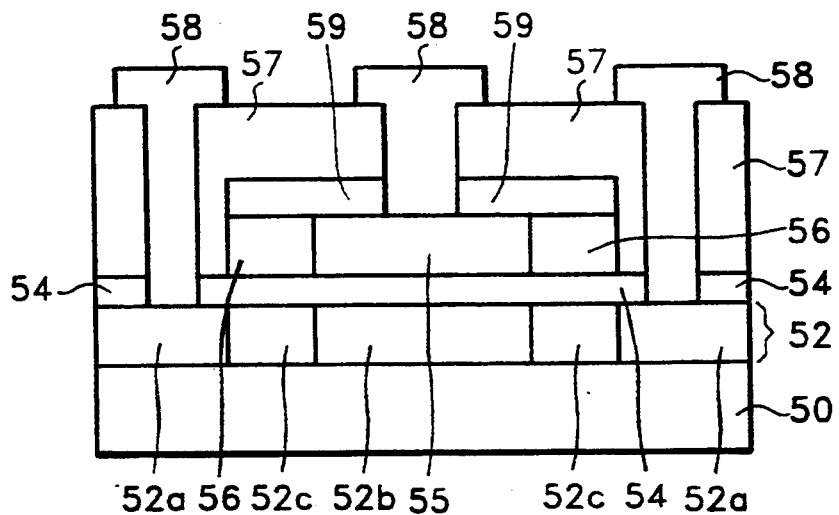
FIG. 4 is a sectional view illustrating an offset-structured MOS TFT according to an embodiment of the present invention.

FIG. 4 is a sectional view illustrating an offset-structured MOS TFT according to another embodiment of the present invention.

Referring to FIG. 4, an offset-structured NMOS TFT according to another embodiment of the present invention will be explained. On an insulating substrate 50, a polysilicon layer 52 is formed, which comprises n+ source and drain regions 52a wherein an n-type impurity has been highly doped, a channel region 52b between source and drain regions 52a and an offset region 52c having a predetermined width between source and drain regions 52a and channel region 52b. On polysilicon layer 52, which comprises of source and drain regions 52a, channel region 52b and offset region 52c, a gate insulating layer 54 is formed. A gate electrode 55 comprising a metal is then formed on a portion of the gate insulating layer 54 over channel region 52b. A metal oxide layer 56 is formed on the sidewall surfaces of gate electrode 55 over offset region 52c. A barrier layer 59 is formed on both the gate electrode 55 and the metal oxide layer 56. Source and drain regions 52a and gate electrode 55 make up an NMOS offset-structured TFT. An insulating interlayer 57 is formed on the structure having the above-described TFT for electrically isolating the TFT from a conductive layer which is formed in a subsequent step. Metal wirings 58 connected to source and drain regions 52a and gate electrode 55 are then formed via contact holes on insulating interlayer 57 for operating the above-described TFT.

In the above-described TFT, a metal with an oxide obtained by anodic oxidation is formed on the sidewalls of the gate electrode 55 so as to extend inwardly and used as a material constituting the gate electrode 55. For example, Ta, Al, Mo, Cr, Zr, Pd, Au, Ag, Co, Ti, Ni, etc. may be used as a metal for forming the gate electrode 55. As a material for barrier layer 59, a metal different than that of the gate electrode 55, an oxide, a nitride, etc. may be used. When the above-mentioned different metal is used, a metal having good conductivity, which can prevent the metal atoms of the gate electrode 55 from penetrating the insulating interlayer 57 formed thereon, is preferably used. Such metals include Cr, Ta, Mo, Ti, Al, Ni, Pd, Au, Ag, Co, Zr, etc. Further, a metal compound thereof such as TiN may be used for forming the barrier layer 59. As an oxide which may be used for the barrier layer 59 in the present invention, silicon oxide ($SiO_2$) may be used. As a nitride which may be used for forming the barrier layer 59 in the present invention, silicon nitride ($Si_3N_4$) may be used.

Metal oxide layer 56 preferably comprises an oxide of the metal constituting the gate electrode 55 which is obtained by anodic oxidization of the metal. For example, as an oxide, $AlO_x$, $TiO_x$, $TaO_x$, $MoO_x$, $CrO_x$, etc. may be used.

FIGS. 7A to 7E are sectional views for illustrating a method for manufacturing an offset-structured TFT according to yet another embodiment of the present invention to manufacture the TFT shown in FIG. 3.

Figure 7A:
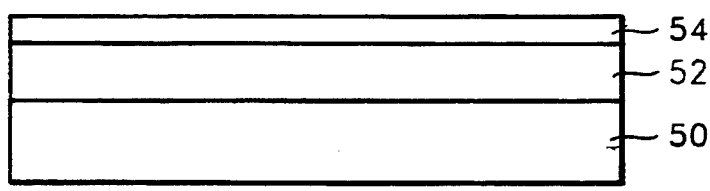
FIGS. 7A to 7E are sectional views for illustrating a method for manufacturing an offset-structured TFT according to an embodiment of the present invention to manufacture a TFT as shown in FIG. 4.

FIG. 7A illustrates the steps in forming a thin polysilicon layer 52 and a gate insulating layer 54. On an insulating substrate 50, such as a glass substrate, polysilicon layer 52 and gate insulating layer 54 are sequentially formed in the same manner as described with reference to FIG. 6A.

Figure 7B:
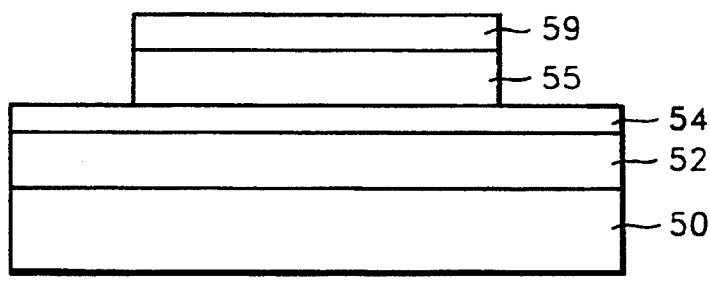

FIG. 7B illustrates the steps in forming a gate electrode 45 and a barrier layer 49. In the same manner as described with reference to FIG. 6B, after forming a first material layer to obtain the gate electrode 55 on the gate insulating layer 54 by depositing a metal, and a second material layer to obtain a barrier layer on the first material layer, the first and second material layers are subsequently patterned via a conventional photolithography process to obtain the gate electrode 55 having a barrier layer 59 formed thereon. As a metal for forming gate electrode 55, a metal such as Al, whose oxide grows so as to expand inwardly during a subsequent anodic oxidation step, may be used.

Figure 7C:
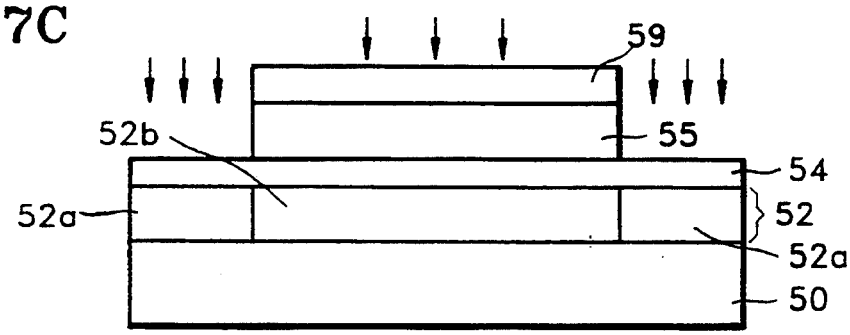

FIG. 7C illustrates the steps in implanting an impurity in polysilicon layer 52 and forming a channel region 52b. After the steps of FIG. 7B, in order to form the source and drain regions of a TFT, an n-type impurity is implanted at a high dosage by using barrier layer 49 as an ion implantation mask, to form source and drain regions 52a in those portions of polysilicon layer 42 which have not been masked by barrier layer 59.

Figure 7D:
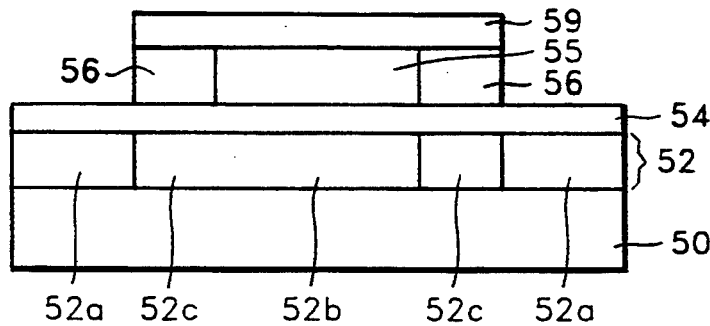

FIG. 7D illustrate steps in forming a metal oxide layer 56 on the sidewall of gate electrode 55. After the steps of FIG. 7C, the above-described structure undergoes an anodic oxidation. Since gate electrode 55 comprises a metal, such as Al, in which the oxide grows so as to expand inwardly during the anodic oxidation step, the metal oxide layer 56 is formed under the edge portion of the barrier layer 59. The anodic oxidation is performed in the same manner as described with reference to FIG. 6D. The portion of polysilicon layer 52 below gate electrode 55 obtained after the anodic oxidation step constitutes a channel region 55 of the TFT. Due to the presence of metal oxide layer 56, offset region 52c, having the same width as the thickness of metal oxide layer 56, is formed in portions of polysilicon layer 52 between source and drain regions 52a and channel region 52b and under metal oxide layer 56.

Figure 7E:
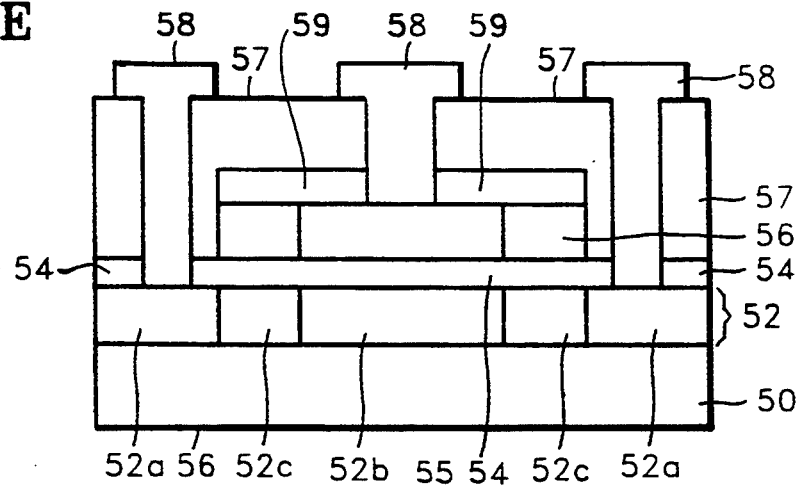

FIG. 7E illustrates the steps in forming an insulating interlayer 57 and metal wirings 58 for operating the TFT. After the steps of FIG. 7D, insulating interlayer 57 and metal wirings 58 are formed in the same manner as described with reference to FIG. 6F to complete an offset-structured MOS TFT of the present invention.

In the above-described offset-structured TFT according to the above-described embodiment of the present invention, the electrical field applied between the gate electrode and the drain region is weakened due to the presence of the offset region, and thus the leakage current may be greatly reduced when a reverse bias voltage is applied. Further, the offset region is self-aligningly formed during the formation of the metal oxide layer, whose thickness may be concisely controlled during the anodic oxidation step. Therefore, the width of the offset region may be precisely controlled.

As shown in the above-described embodiment of the present invention, an offset-structured or an LDD-structured MOS TFT may be manufactured by a low temperature (about 600° C.) manufacturing process rather than a conventional high temperature process. Therefore, for manufacturing the offset-structured and the LDD-structured MOS TFT, a cheap glass substrate instead of an expensive quartz substrate can be used.

Figure 5:
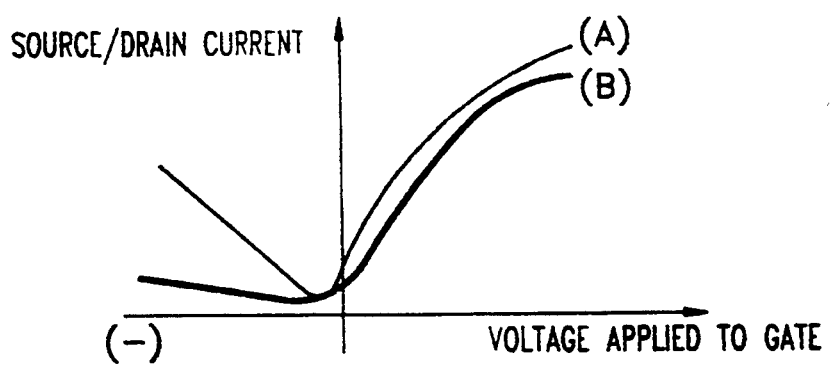
FIG. 5 illustrates the leakage current observed in the source/drain regions of the TFTs when various gate bias voltages were applied.

FIG. 5 illustrates the leakage current observed in the source/drain regions of the TFTs when various gate bias voltages were applied. In this figure, plot A has been obtained by using a conventional MOS TFT which has neither the LDD nor the offset structure and plot B has been obtained using the TFTs as shown in FIGS. 3 and 4. As can be seen from FIG. 5, the leakage current is suppressed when a reverse bias voltage was applied. Therefore, when the TFT of the present invention was applied to a liquid crystal display device, its operation stability and quality, such as the contrast ratio thereof, are enhanced.

The width of the LDD region or offset region may be concisely controlled by the metal oxide layer which is formed by the anodic oxidation. Therefore, reproducibility is excellent. The metal oxide layer covers the sidewalls of the gate electrode, which enhances the reliability of the TFT.

Moreover, as a material for the gate electrode, a low resistant metal is used; which circumvents the signal delay problem. Therefore, the TFT of the present invention may be applied to a device which has a large area and a high packaging density, for example, an HDTV. Further, the linewidth of the TFT may be reduced to improve brightness.

Due to the presence of the barrier layer on the gate electrode, the thickness of the gate electrode can be easily controlled. The barrier layer prevents the anodic oxidation on the upper surface of the gate electrode, whereby thinning the gate electrode may be avoided.

When the barrier layer is formed so as to have a thickness which is similar to the thickness of the gate insulating layer, the etching may be uniformly performed on the source and drain regions and on the gate electrode.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A thin film transistor, comprising:
   an insulating substrate;
   a polysilicon layer comprising source and drain regions formed therein, a channel region formed between said source and drain regions, an impurity doped region formed between said source and channel regions and between said drain and channel regions;
   a gate insulating layer formed on said polysilicon layer;
   a gate electrode formed on said gate insulating layer over said channel region, said gate electrode comprising a metal;
   a metal oxide layer formed on the sidewalls of said gate electrode over said impurity doped region; and
   a barrier layer formed on said gate electrode.

2. The thin film transistor according to claim 1, wherein said impurity-doped region has a lower impurity concentration than that of said source and drain regions.

3. The thin film transistor according to claim 1, wherein said gate electrode comprises a metal in which an oxide is formed so as to extend outwardly during oxidization of the sidewall surface portion of said gate electrode for forming said metal oxide layer.

4. The thin film transistor according to claim 1, wherein said metal oxide layer comprises an oxide of said metal of said gate electrode.

5. The thin film transistor according to claim 1, wherein said barrier layer comprises at least one selected from the group consisting of a metal different than the metal consisting of said gate electrode, an oxide and a nitride.

6. The thin film transistor according to claim 4, wherein said barrier layer comprises at least one metal selected from the group consisting of Mo, Ta, Al, Ni, Zr, Ti, Pd, Au, Ag and Co.

7. A thin film transistor, comprising:
   an insulating substrate;
   a polysilicon layer comprising source and drain regions formed therein, a channel region formed between said source and drain regions, an offset region formed between said source and channel regions and between said drain and channel regions;
   a gate insulating layer formed on said polysilicon layer;
   a gate electrode formed on said gate insulating layer over said channel region, said gate electrode comprising a metal;
   a metal oxide layer formed on the sidewalls of said gate electrode over said offset region; and
   a barrier layer formed on both said gate electrode and said metal oxide layer.

8. The thin film transistor according to claim 7, wherein said gate electrode comprises a metal whose oxide is formed so as to extend inwardly during anodic oxidization of the sidewall surface portion of said gate electrode for forming said metal oxide layer.

* * * * *